く12) United States Patent
Li et al.

(10) Patent No.: US 10,431,669 B2
(45) Date of Patent: Oct. 1, 2019

(54) POLYSILICON THIN FILM AND MANUFACTURING METHOD THEREOF, TFT AND MANUFACTURING METHOD THEREOF, AND DISPLAY PANEL

(71) Applicant: BOE TECHNOLOGY GROUP CO., LTD., Beijing (CN)

(72) Inventors: Xiaolong Li, Beijing (CN); Zheng Liu, Beijing (CN); Xiaoyong Lu, Beijing (CN); Dong Li, Beijing (CN); Chunping Long, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 1 day.

(21) Appl. No.: 15/116,980

(22) PCT Filed: Oct. 16, 2015

(86) PCT No.: PCT/CN2015/092080
§ 371 (c)(1),
(2) Date: Aug. 5, 2016

(87) PCT Pub. No.: WO2016/206244
PCT Pub. Date: Dec. 29, 2016

(65) Prior Publication Data
US 2018/0108757 A1 Apr. 19, 2018
US 2018/0337262 A9 Nov. 22, 2018

(30) Foreign Application Priority Data
Jun. 23, 2015 (CN) .......................... 2015 1 0350269

(51) Int. Cl.
*H01L 29/66* (2006.01)
*H01L 21/20* (2006.01)
(Continued)

(52) U.S. Cl.
CPC .... H01L 29/66757 (2013.01); H01L 21/2026 (2013.01); H01L 21/265 (2013.01);
(Continued)

(58) Field of Classification Search
CPC ............... H01L 29/66757; H01L 21/28; H01L 21/2026; H01L 21/265; H01L 27/1296;
(Continued)

(56) References Cited

U.S. PATENT DOCUMENTS 5,045,905 A * 9/1991 Motai ................... H01L 21/223
257/352
5,907,008 A * 5/1999 Nakano ..................... C08K 3/22
524/430

(Continued)

FOREIGN PATENT DOCUMENTS

CN 1567550 A 1/2005
CN 1735840 A 2/2006
(Continued)

OTHER PUBLICATIONS

F. J. Grunthaner et al., High-Resolution X-Ray Photoelectron Spectroscopy as a Probe of Local Atomic Structure: Application to Amorphous SiO2 and the Si-SiO2 Interface, Nov. 26, 1979, The American Physical Society, Physical Review Letters , vol. 43, No. 22, 1683-1686.*

(Continued)

*Primary Examiner* — Joseph C. Nicely
*Assistant Examiner* — Pavel G Ivanov
(74) *Attorney, Agent, or Firm* — Armstrong Teasdale LLP

(57) ABSTRACT

A manufacturing method for a polysilicon thin film is provided. The manufacturing method for a polysilicon thin film includes forming a polysilicon layer, treating a surface of the polysilicon layer so that the surface of the polysilicon layer is electronegative, and supplying polar gas into a
(Continued)

process chamber so that polar molecules of the polar gas are adsorbed on the surface of the polysilicon layer which is electronegative so as to form the polysilicon thin film, a surface of which has a hole density higher than an electron density.

14 Claims, 3 Drawing Sheets

(51) Int. Cl.
*H01L 21/265* (2006.01)
*H01L 21/28* (2006.01)
*H01L 27/12* (2006.01)
*H01L 29/06* (2006.01)
*H01L 29/786* (2006.01)

(52) U.S. Cl.
CPC .......... *H01L 21/28* (2013.01); *H01L 27/1281* (2013.01); *H01L 27/1296* (2013.01); *H01L 29/06* (2013.01); *H01L 29/78696* (2013.01)

(58) Field of Classification Search
CPC ..... H01L 27/1281; H01L 29/06; H01L 27/12; H01L 21/02; H01L 21/77; H01L 21/02359; H01L 21/02664; H01L 29/78696; H01L 29/78612; G02F 1/00
See application file for complete search history.

(56) References Cited

U.S. PATENT DOCUMENTS

| | | | |
|---|---|---|---|
| 6,875,676 B2 | 4/2005 | Wieczorek et al. | |
| 7,115,449 B2 | 10/2006 | Yeh et al. | |
| 2002/0048635 A1* | 4/2002 | Kim | B05D 1/60 427/331 |
| 2006/0267115 A1* | 11/2006 | Takeguchi | H01L 29/4908 257/411 |

FOREIGN PATENT DOCUMENTS

| | | |
|---|---|---|
| CN | 101740387 A | 6/2010 |
| CN | 102646593 A | 8/2012 |
| CN | 103551595 A | 1/2014 |
| CN | 104659109 A | 5/2015 |
| JP | S59136926 A | 8/1984 |
| JP | H08181317 A | 7/1996 |
| JP | H11233776 A | 8/1999 |

OTHER PUBLICATIONS

G. P. Lopinski et al., Enhanced conductance of chlorine-terminated Si(111) surfaces: Formation of a two-dimensional hole gas via chemical modification, Mar. 15, 2005, The American Physical Society, Physical Review B 71, 125308 1-4.*

Xiangbin Zeng et al., Improving reliability of poly-Si TFTs with channel layer and gate oxide passivated by NH3/N2O plasma, Elsevier, Microelectronics Reliability, vol. 44, pp. 435-442 (Year: 2004).*

PCT (CN) Written Opinion, Application No. PCT/CN2015/092080, dated Apr. 1, 2016, 6 pgs.: with English translation.

China First Office Action with Search Report, Application No. 201510350269.7, dated Jun. 30, 2017, 16 pgs.: with English translation.

Chinese language International Search Report and Written Opinion, dated Apr. 1, 2016, for PCT/CN2015/092080.

China Third Office Action, Application No. 201510350269.7, dated Feb. 25, 2019, 15 pps.: with English translation.

* cited by examiner

POLYSILICON THIN FILM AND MANUFACTURING METHOD THEREOF, TFT AND MANUFACTURING METHOD THEREOF, AND DISPLAY PANEL

CROSS-REFERENCE TO RELATED APPLICATIONS

This application is a National Stage Entry of PCT/CN2015/092080 filed Oct. 16, 2015, which claims the benefit and priority of Chinese Patent Application No. 201510350269.7, filed on Jun. 23, 2015, the entire content of each of which is incorporated by reference herein as a part of this application.

BACKGROUND

The embodiments of the disclosure relate to a polysilicon thin film and a manufacturing method thereof, a TFT including the polysilicon thin film and a manufacturing method thereof, and a display panel including the TFT.

Low-temperature polysilicon (LTPS) thin film transistor (TFT) are widely used in liquid crystal display panels (LCDs) and organic light-emitting diode display panels (OLEDs) due to its advantages of high mobility, low power consumption, being light and thin, and so on. However, when illumination, high temperature, stress or the like is applied to the LTPS TFT, leakage current significantly increases. This problem impedes the development of low-temperature polysilicon display panels to some extent.

In the prior art, the leakage current of low temperature polysilicon devices is reduced mainly by a method of providing a lightly doped drain region (LDD). As shown in FIG. 1, a lightly doped drain region 2 is provided at positions of a channel region 1 close to a source and a drain of a thin film transistor device and bears partial voltage of the source-drain voltage to reduce the leakage current. However, a mask process would be added in such a method, which increases production cost. In addition, the accuracy of a photoresist mask is about 2 μm, which is difficult to meet the requirements of small-sized channel.

SUMMARY OF THE INVENTION

The embodiments of the present invention disclosure provide a polysilicon thin film and a manufacturing method thereof, a TFT and a manufacturing method thereof, and a display panel so as to reduce the leakage current.

As a first aspect of the embodiments of the present disclosure, a manufacturing method of a polysilicon thin film is provided, the manufacturing method including steps of forming a polysilicon layer, supplying oxygen into a process chamber and performing oxygen plasma treatment on a surface of the polysilicon so that oxygen terminal groups are formed on the surface of the polysilicon layer, and supplying polar gas into the process chamber so that polar molecules of the polar gas are adsorbed onto the oxygen terminal groups formed on the surface of the polysilicon layer so as to form the polysilicon thin film, the surface of the polysilicon layer in the formed polysilicon thin film has a hole density higher than an electron density.

In an exemplary embodiment of the present disclosure, in the step of performing oxygen plasma treatment on the surface of the polysilicon layer, gas pressure in the process chamber is maintained in a range of 1100 to 1300 mTorr and treatment time is in a range of 250 to 350 seconds.

In an exemplary embodiment of the present disclosure, the manufacturing method further includes a step of vacuumizing the process chamber before supplying the polar gas into the process chamber.

In an exemplary embodiment of the present disclosure, in the step of supplying the polar gas into the process chamber, gas pressure in the process chamber is maintained in a range of 50 to 150 mTorr and supplying time of the polar gas is in a range of 30 to 50 minutes.

In an exemplary embodiment of the present disclosure, the polar gas includes any one or more kinds of NO2 and NH3.

In an exemplary embodiment of the present disclosure, the step of forming a polysilicon layer includes forming an amorphous silicon layer on a base substrate, and performing an excimer laser annealing treatment on the amorphous silicon layer to form the polysilicon layer.

As a second aspect of the embodiments of the present disclosure, a manufacturing method of a TFT is provided, the manufacturing method of the TFT including a step of using above manufacturing method provided in the first aspect of the embodiments of the present disclosure to form a polysilicon thin film in a channel region of the TFT.

In an exemplary embodiment of the present disclosure, the manufacturing method of a TFT further includes, after forming the polysilicon thin film, the steps of sequentially forming a first insulating layer and a patterned gate on the polysilicon thin film, forming a second insulting layer on the gate, forming via-holes penetrating through the second insulating layer and the first insulating layer on opposite sides of the gate respectively, and forming a source contact and a drain contact on the second insulating layer and in the via-holes, the source contact and the drain contact being connected to a source and a drain on opposite sides of the polysilicon thin film respectively.

As a third aspect of the embodiments of the present disclosure, a polysilicon thin film is provided, the polysilicon thin film being manufactured by the manufacturing method of a polysilicon thin film according to the first aspect, a surface of the polysilicon layer in the polysilicon thin film having a hole density higher than an electron density.

In an exemplary embodiment of the present disclosure, the surface of the polysilicon layer is formed to have Si—O dipoles thereon, with polar molecules adsorbed by a part of the Si—O dipoles on the surface of the polysilicon layer.

As a fourth aspect of the embodiments of the present disclosure, a TFT is provided, the TFT including, in a channel region, a polysilicon thin film formed by the manufacturing method provided in the first aspect of the embodiments of the present disclosure or the polysilicon thin film provided in the third aspect of the embodiments of the present disclosure.

As a fifth aspect of the embodiments of the present disclosure, a display panel is provided, the display panel including a TFT formed by the manufacturing method provided in the second aspect of the embodiments of the present disclosure or the TFT provided in the fourth aspect of the embodiments of the present disclosure.

The surface of the polysilicon layer in the polysilicon thin film manufactured in accordance with the embodiments of the present disclosure has accumulated a lot of holes thereon so that a stable hole conductive channel is formed. Since holes have a low migration rate, leakage effect due to the illumination, high temperature, stress or the like can be effectively alleviated, and thereby leakage current of the TFT device is effectively reduced.

BRIEF DESCRIPTION OF THE DRAWINGS

For the sake of describing the technical solutions of the embodiments of the present disclosure more clearly, the accompany drawings of the embodiments will be briefly introduced below, and obviously, the accompany drawings described below merely relate to some embodiments of the present disclosure and are not a limitation to the present invention.

DETAILED DESCRIPTION OF THE INVENTION

Figure 1:
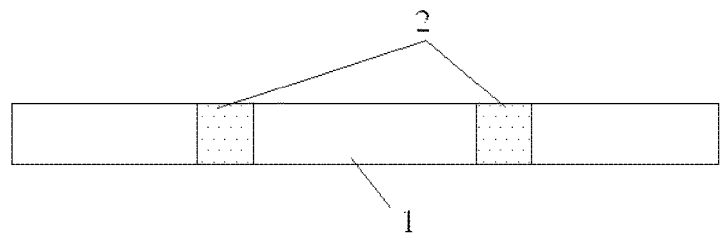
FIG. 1 is a channel region structure for reducing leakage current in the prior art.

The technical solutions of the embodiments of the present invention will be described clearly and thoroughly hereinafter in conjunction with the drawings in respective embodiments in order to make the objects, the solutions and the advantages of the embodiments of the present invention more clear. Obviously, the embodiments described are only some rather than all of the embodiments of the present invention. Other embodiments may be obtained by one ordinary person skilled in the art based on the embodiments in the present invention without any creative work, and such other embodiments are within the scope of the present invention.

In the description of the present invention, it should be noted that the oriental or positional relationship indicated by the terms "upper", "lower", "top", "bottom" or the like is the oriental or positional relationship shown in the drawings, and such terms are used only for the purpose of description and simplifying the description rather than indicating or suggesting that the device or element indicated must be in a specific orientation, be structured and operated in a specific orientation. Such terms shall not be deemed to limit the scope of the present invention.

Furthermore, in the description of the present invention, the expression "multiple" means two or more unless otherwise specified.

A first aspect of embodiments of present disclosure provides a manufacturing method of a polysilicon thin film, the manufacturing method including steps of forming a polysilicon layer, supplying oxygen gas into a process chamber and performing oxygen plasma treatment on a surface of the polysilicon layer so that oxygen terminal groups are formed on the surface of the polysilicon layer, and supplying polar gas into the process chamber so that polar molecules of the polar gas are adsorbed onto the oxygen terminal groups formed on the surface of the polysilicon layer so as to form the polysilicon thin film, the surface of the polysilicon layer in the formed polysilicon thin film has a hole density higher than an electron density.

The surface of the existing polysilicon thin film is electrically neutral, i.e., has a hole density the same as an electron density. Since electrons have a faster migration rate, it is likely to form a surface leakage current. The polysilicon layer before the oxygen plasma treatment in the present disclosure is equivalent to the existing polysilicon thin film, the surface of which is electrically neutral. After the oxygen plasma treatment performed on the surface of the polysilicon layer, the oxygen terminal groups formed on the surface of the polysilicon layer are electronegative so that they can adsorb polar molecules. After the adsorption of the polar molecules, electrons migrate toward terminals of polar molecules because of the low chemical potential of polar molecules, so that holes accumulate massively at the surface of the polysilicon layer in the formed polysilicon thin film, which shows macroscopically that a stable hole conductive channel is formed at the surface of the polysilicon layer in the formed polysilicon thin film. Due to the low migration rate of the holes, the leakage effect caused by illumination, high temperature, stress or the like can be effectively alleviated, and thereby the leakage current of the TFT device can be effectively reduced.

Figure 2A:
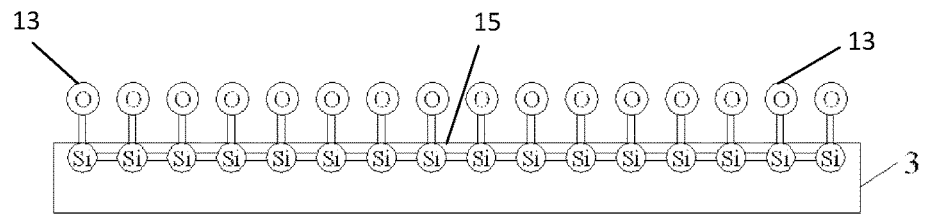
FIGS. 2a-2b are schematic diagrams of a flow chart of manufacturing a polysilicon thin film in embodiments of the present invention.

According to an exemplary embodiment of the present disclosure, as shown in FIG. 2a, the step of treating a surface 15 of the polysilicon layer 3 includes supplying oxygen gas into the process chamber and performing oxygen plasma treatment on the surface 15 of the polysilicon layer 3. Thus Si—O dipoles are formed on the surface 15 of the polysilicon layer 3. That is, stable oxygen terminal groups 13, which are electronegative, are formed on the surface 15 of the polysilicon layer 3.

In above treatment step, gas pressure in the process chamber is controlled to be 1100 to 1300 mTorr, for example, 1200 mTorr; treatment time is controlled to be 250 to 350 seconds, for example, 300 seconds; the flow rate for supplying the oxygen gas is about 2000 sccm.

In an exemplary embodiment of the present disclosure, the manufacturing method further includes, before supplying the polar gas into the process chamber, a step of vacuumizing the process chamber so as to remove pre-existing gas in the process chamber. After the vacuumizing step, the polar gas is supplied into the process chamber so as to secure the adsorption efficiency and adsorption stability of the polar molecules in the polar gas.

Figure 2B:
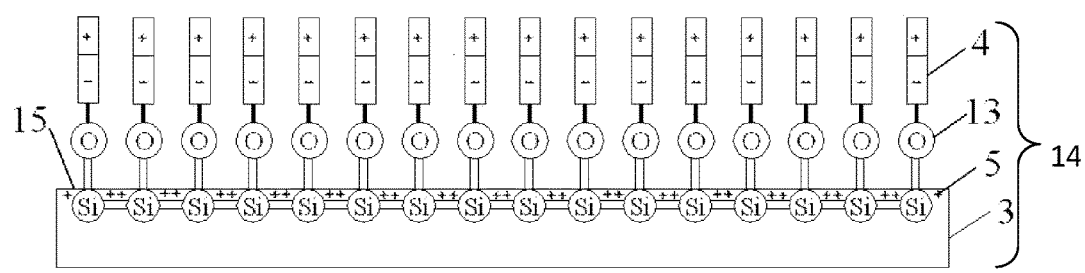

FIG. 2b is a schematic diagram illustrating the surface 15 of the polysilicon layer 3 after supplying the polar gas into the process chamber in an exemplary embodiment in which the surface treatment is performed using oxygen gas. When the surface 15 of the polysilicon layer 3 having the oxygen terminal groups thereon is exposed to the polar gas, the surface 15 of the polysilicon layer 3 will adsorb the polar molecules 4 in the polar gas so that an electrochemical system is formed. In this electrochemical system, due to the adsorption of polar molecules 4 by the Si—O dipoles, the energy band of silicon is bended such that the electrons tend to migrate from the silicon layer toward the polar molecules and thereby holes 5 are accumulated at the surface 15 of the polysilicon layer 3, as a result of which a stable hole conductive channel is formed. Thus a polysilicon thin film 14 is formed, in which polar molecules 4 are adsorbed by a part of the Si—O dipoles on the surface 15 of the polysilicon layer 3.

According to an exemplary embodiment of the present disclosure, in the step of supplying the polar gas into the process chamber, gas pressure in the process chamber is controlled to be in a range of 50 to 150 mTorr, for example, 100 mTorr, and the supplying time of the polar gas is controlled to be in a range of 30 to 50 minutes, for example, 40 minutes, so as to achieve desirable adsorption efficiency.

In an exemplary embodiment of the present disclosure, the polar gas includes any one or more kinds of NO2, NH3, or the like. Accordingly, the polar molecules 4 may be any one or more kinds of NO2 molecules, NH3 molecules, or the like.

Figure 3A:
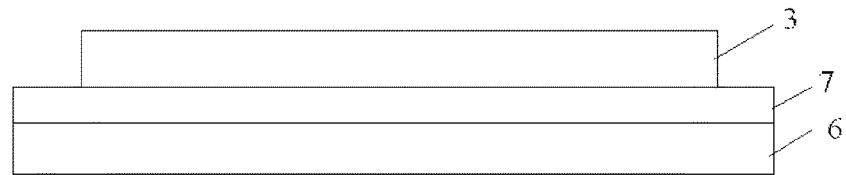
FIGS. 3a-3d are schematic diagrams of a flow chart of manufacturing a TFT in embodiments of the present disclosure.

In an exemplary embodiment of the present disclosure, as shown in FIG. 3a, the step of forming a polysilicon layer includes, forming an amorphous silicon layer (a-silicon layer) on a base substrate 6, and performing an excimer laser annealing treatment on the amorphous silicon layer to form the polysilicon layer 3.

Figure 3B:
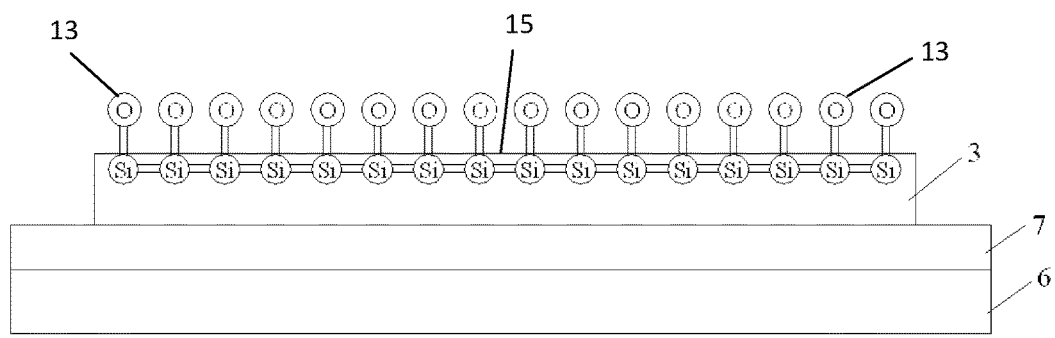
Figure 3C:
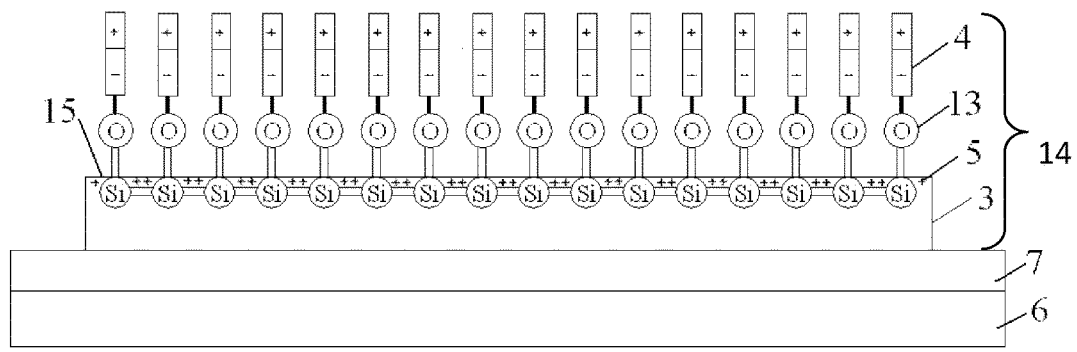

According to an exemplary embodiment of the present disclosure, as shown in FIGS. 3a-3c, a buffer layer 7 is provided between the base substrate 6 and the polysilicon layer 3, and includes a silicon nitride layer in contact with the base substrate 6 and a silicon oxide layer in contact with the polysilicon layer 3. The silicon nitride layer functions to separate the base substrate 6 from the polysilicon layer 3, and the silicon oxide layer functions to match the lattice with the polysilicon layer 3.

A second aspect of the embodiments of the present disclosure provide a manufacturing method of a thin film transistor (TFT) including a step of using above manufacturing method provided in the first aspect of the embodiments of the present disclosure to form a polysilicon thin film in a channel region of the thin film transistor.

As described above, the TFT formed by the method of the second aspect of the embodiments of the present disclosure is capable of reducing leakage current effectively.

Figure 3D:
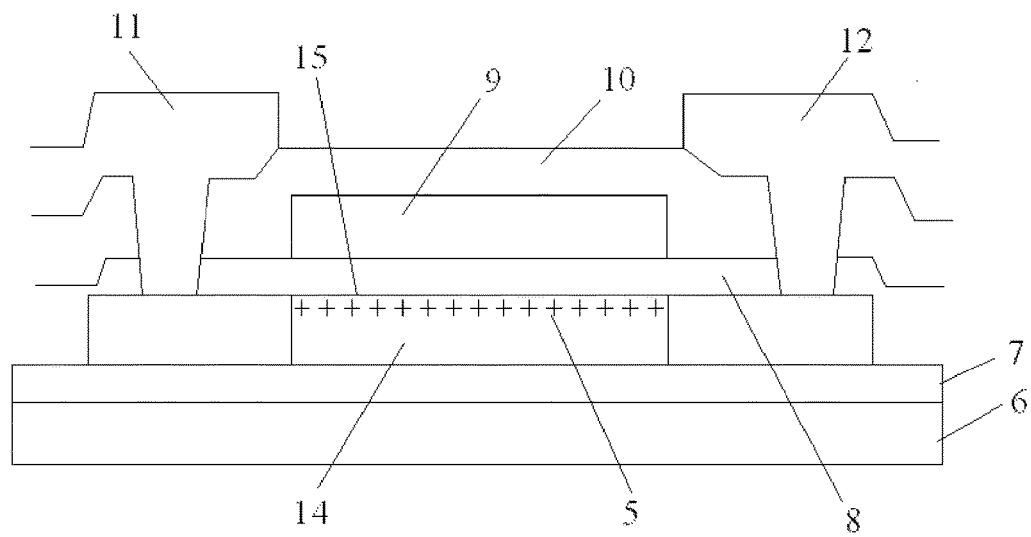

According to an exemplary embodiment of the present disclosure, as shown in FIG. 3d, the manufacturing method of a TFT in the second aspect further includes, after forming the polysilicon thin film 14, the steps of sequentially forming a first insulating layer 8 and a patterned gate 9 on the polysilicon thin film 14, forming a second insulting layer 10 on the gate 9, forming via-holes penetrating through the second insulating layer 10 and the first insulating layer 8 on opposite sides of the gate 9 respectively, and forming a source contact 11 and a drain contact 12 on the second insulating layer 10 and in the via-holes, the source contact 11 and the drain contact 12 being connected to a source and a drain on opposite sides of the polysilicon thin film 14 respectively.

A third aspect of the embodiments of the present disclosure provide a polysilicon thin film manufactured by the manufacturing method of a polysilicon thin film according to the first aspect, a surface of the polysilicon layer in the polysilicon thin film having a hole density higher than an electron density. As shown in FIGS. 2b, 3c, and 3d, the surface 15 of the polysilicon layer 3 in the polysilicon thin film 14 has accumulated a lot of holes 5. Since holes have a low migration rate, the photo-induced leakage effect and the leakage effect due to high temperature, stress or the like can be effectively alleviated, and thereby leakage current of a TFT which uses this polysilicon thin film as a channel region is reduced.

According to an exemplary embodiment of the present disclosure, the surface of the polysilicon layer is formed to have Si—O dipoles thereon, with polar molecules adsorbed by a part of the Si—O dipoles on the surface of the polysilicon layer. Due to the adsorption of polar molecules by the Si—O dipoles, the energy band of silicon is bended such that the electrons tend to migrate from the silicon layer toward the polar molecules and thereby a lot of holes are accumulated at the surface of the polysilicon layer in the formed polysilicon thin film, making the surface of the polysilicon layer in the formed polysilicon thin film have a hole density larger than the electron density.

A fourth aspect of the embodiments of the present disclosure provide a thin film transistor (TFT) including, in a channel region, a polysilicon thin film formed by the manufacturing method provided in the first aspect of the embodiments of the present disclosure or the polysilicon thin film provided in the third aspect of the embodiments of the present invention. The TFT can be used in a display panel (for example, in an array substrate of the display panel), can effectively reduce the leakage current in the display panel, and can promote the display quality.

Figure 4:
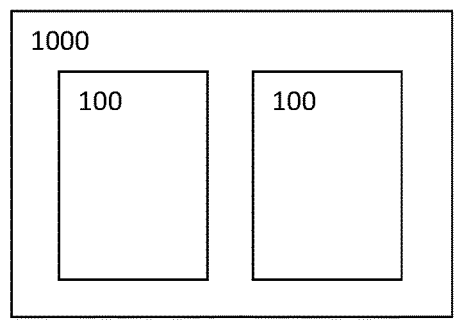
FIG. 4 is a schematic diagram of a display panel including a TFT.

A fifth aspect of the embodiments of the present disclosure provides a display panel 1000, as shown in FIG. 4, including a TFT 100 formed by the manufacturing method provided in the second aspect of the embodiments of the present disclosure or the TFT 100 provided in the fourth aspect of the embodiments of the present invention. As described above, the display panel 1000 provided in the fifth aspect of the embodiments of the present disclosure has good display quality because of the improvement in the leakage current. In FIG. 4, two TFTs 100 are shown. However, the number of the TFTs 100 is not limited, and there may be any number of the TFTs 100 in the display panel 1000 as required.

Above described are merely exemplary embodiments of the present invention, which is not intended to limit the protection scope of present disclosure defined by the appended claims.

What is claimed is:

1. A manufacturing method of a polysilicon thin film, the method comprising:
   forming a polysilicon layer;
   after forming the polysilicon layer, supplying oxygen gas into a process chamber and performing oxygen plasma treatment on a surface of the polysilicon layer so that oxygen terminal groups are formed on the surface of the polysilicon layer; and
   after supplying the oxygen gas, supplying polar gas into the process chamber so that polar molecules of the polar gas are adsorbed onto the oxygen terminal groups formed on the surface of the polysilicon layer so as to form the polysilicon thin film, the surface of the polysilicon layer in the formed polysilicon film has a hole density higher than an electron density.

2. The manufacturing method of a polysilicon thin film according to claim 1, wherein performing oxygen plasma treatment on the surface of the polysilicon layer includes maintaining a gas pressure in the process chamber in a range of 1100 to 1300 mTorr and a treatment time in a range of 250 to 350 seconds.

3. The manufacturing method of a polysilicon thin film according to claim 1, further comprising vacuumizing the process chamber before supplying the polar gas into the process chamber.

4. The manufacturing method of a polysilicon thin film according to claim 1, wherein supplying the polar gas into the process chamber includes maintaining a gas pressure in the process chamber in a range of 50 to 150 mTorr and supplying the polar gas over a time period in a range of 30 to 50 minutes.

5. The manufacturing method of a polysilicon thin film according to claim 1, wherein the polar gas includes any one or more kinds of NO2 and NH3.

6. The manufacturing method of a polysilicon thin film according to claim 1, wherein forming a polysilicon layer comprises:

forming an amorphous silicon layer on a base substrate; and performing an excimer laser annealing treatment on the amorphous silicon layer to form the polysilicon layer.

7. The manufacturing method of a polysilicon thin film according to claim 6, wherein a buffer layer is provided between the base substrate and the polysilicon layer, and includes a silicon nitride layer in contact with the base substrate and a silicon oxide layer in contact with the polysilicon layer.

8. A manufacturing method of a TFT comprising using the manufacturing method of a polysilicon thin film according to claim 1 to form a polysilicon thin film in a channel region of the TFT.

9. The manufacturing of a TFT according to claim 8, further comprising, after forming the polysilicon thin film, the steps of sequentially forming a first insulating layer and a patterned gate on the polysilicon thin film;

forming a second insulting layer on the gate;

forming a first via-hole penetrating through the second insulating layer and the first insulating layer on a first lateral side of the gate, and a second via-hole penetrating through the second insulating layer and the first insulating layer on a second lateral side opposite the first lateral side of the gate, respectively; and forming a source contact, on the second insulating layer and in the first via-hole and a drain contact, on the second insulating layer and in the second via-hole, respectively, wherein the source contact is connected to a source of the TFT, and wherein the drain contact is connected a drain of the TFT.

10. A polysilicon thin film manufactured by the manufacturing method of a polysilicon thin film according to claim 1, a surface of the polysilicon layer in the polysilicon thin film has a hole density higher than an electron density.

11. A TFT, comprising, a polysilicon thin film formed by the manufacturing method according to claim 1.

12. A display panel comprising a TFT formed by the manufacturing method according to claim 8.

13. A TFT, comprising the polysilicon thin film according to claim 10.

14. A display panel comprising the TFT according to claim 11.

* * * * *